(12) United States Patent
Nam et al.

(10) Patent No.: US 8,229,111 B2
(45) Date of Patent: Jul. 24, 2012

(54) SECURITY CIRCUIT USING AT LEAST TWO FINITE STATE MACHINE UNITS AND METHODS USING THE SAME

(75) Inventors: Kyung-Wan Nam, Gyeonggi-Do (KR); Jae-Chul Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1081 days.

(21) Appl. No.: 11/353,085

(22) Filed: Feb. 14, 2006

(65) Prior Publication Data
US 2007/0171754 A1   Jul. 26, 2007

(30) Foreign Application Priority Data
Feb. 22, 2005 (KR) .................. 10-2005-0014652

(51) Int. Cl.
*G06F 21/00* (2006.01)
(52) U.S. Cl. ............... 380/29; 380/37; 380/42; 370/469; 709/223
(58) Field of Classification Search .................. 380/276, 380/277, 278, 284, 286; 713/182–185, 176; 726/28, 30, 33; 714/22–30
See application file for complete search history.

(56) References Cited

U.S. PATENT DOCUMENTS

| 6,549,622 | B1 | 4/2003 | Matthews, Jr. | |
| 6,980,649 | B1 * | 12/2005 | Batcher | 380/42 |
| 2002/0186839 | A1 * | 12/2002 | Parker et al. | 380/37 |
| 2003/0091185 | A1 | 5/2003 | Swindlehurst et al. | |
| 2004/0203591 | A1 | 10/2004 | Lee | |
| 2005/0132040 | A1 * | 6/2005 | Ellis et al. | 709/223 |
| 2005/0232303 | A1 * | 10/2005 | Deforche et al. | 370/469 |

FOREIGN PATENT DOCUMENTS

| KR | 10-2002-0071328 | 9/2002 |
| KR | 10-2003-0078453 | 10/2003 |
| KR | 10-2005-0014948 | 2/2005 |
| KR | 10-1999-0058090 | 7/2005 |

OTHER PUBLICATIONS

Balderas-Contreras, "An Efficient Reuse-Based Approach to Implement the 3GPP KASUMI Block Cipher", 2004, IEEE.*
Office Action for corresponding Korean Application No. 10-2005-0014652 dated Aug. 24, 2006 and English translation thereof.

* cited by examiner

*Primary Examiner* — Taghi Arani
*Assistant Examiner* — Gregory Lane
(74) *Attorney, Agent, or Firm* — Harness, Dickey & Pierce, P.L.C.

(57) ABSTRACT

A security circuit using at least two finite state machine units for storing data to and reading data from a multiport memory in a pipelined manner and an intermediate memory, for facilitating transfer of data between the at least two finite state machines. The security circuit may be used to perform key setup and/or data ciphering faster. The security circuit may operate in any environment where the key is changed every frame, for example, a wireless LAN application and the security circuit may operate in conjunction with, or as part of, a MAC controller.

24 Claims, 10 Drawing Sheets

Fig. 10

| CLK | 1 | 2 | 3 | 4 | 5 | 6 | 7 | 8 | 9 | 10 | 11 | 12 | ... | 509 | 510 | 511 | 512 | 513 | 514 |
|---|---|---|---|---|---|---|---|---|---|---|---|---|---|---|---|---|---|---|---|
| Read S[i] from addr i | 0 |  | 1 |  | 2 |  | 3 |  | 4 |  | 5 |  | ... | 254 |  | 255 |  |  |  |
| Read S[j] from addr j |  | j1 |  | j2 |  | j3 |  | j4 |  | j5 |  | j6 | ... |  | j255 |  | j256 |  |  |
| Write S[j] to addr i |  |  | 0 |  | 1 |  | 2 |  | 3 |  | 4 |  | ... | 253 |  | 254 |  | 255 |  |
| Write S[i] to addr j |  |  |  | j1 |  | j2 |  | j3 |  | j4 |  | j5 | ... |  | j254 |  | j255 |  | j256 |

Fig. 11

| CLK | 1 | 2 | 3 | 4 | 5 | 6 | 7 | 8 | 9 | 10 | 11 | 12 | ... | 764 | 765 | 766 | 767 | 768 | 769 |
|---|---|---|---|---|---|---|---|---|---|---|---|---|---|---|---|---|---|---|---|
| Read S[i] from addr i | 0 | | | 1 | | | 2 | | | 3 | | | ... | | | 255 | | | |
| Read S[j] from addr j | | j0 | | | j1 | | | j2 | | | j3 | | ... | j255 | | | j256 | | |
| Read S[x] | | | X0 | | | X1 | | | X2 | | | X3 | ... | | X255 | | X256 | | |
| Write S[i] to addr j | | | j0 | | | j1 | | | j2 | | | j3 | ... | | j255 | | j256 | | |
| Write S[j] to addr i | | | | 0 | | | 1 | | | 2 | | | ... | | | 255 | | | 256 |
| NOP | | | | | NOP | | | NOP | | | NOP | | ... | NOP | | | NOP | | |

SECURITY CIRCUIT USING AT LEAST TWO FINITE STATE MACHINE UNITS AND METHODS USING THE SAME

PRIORITY STATEMENT

This U.S. non-provisional application claims priority under 35 U.S.C. §119 of Korean Patent Application No. P2005-0014652, filed on Feb. 22, 2005, the entire contents of which are incorporated by reference.

BACKGROUND OF THE INVENTION

The RC4 algorithm developed by RSA Data Security Inc. is an example of an encryption algorithm used for Internet web browsing. Prior to using the RC4 algorithm for encrypting data, a key setup process must be performed.

According to at least one wireless LAN security protocol, the key should be changed for every frame and key setup should be performed for every frame. Due the number of times key setup may be performed, reducing the key setup time may be important.

Also, at least one wireless LAN security protocol, allocates a fairly short time for building an encryption key and preparing a frame body. As an example, the 802.11g-OFDM wireless LAN security protocol allocates 12.5 μsec for building the encryption key and preparing the frame body.

A prior art system using a single finite state machine unit, a sequential architecture or a single port memory may require several clock cycles for data dependency and, as a result, it may become more difficult to set up the encryption key and prepare the frame body.

The RC4 algorithm uses a private key based on a stream cipher method. For ciphering the key and data, the RC4 algorithm may use a state table or "substitution box" (Sbox) for generating a pseudo-random number (PRN).

As shown in FIG. 1, the RC4 algorithm has three main steps or phases. The first step S100 is an initialization step in which the state table or Sbox is initialized. As shown in S100, address i and data S[i] are arranged in the Sbox. The Sbox may be initialized by setting each location equal to an index value. For example, for a 256 element array, for i=0 to 255, Sbox[i]=i. A second, key array of the same size may be filled with the key value, repeating bytes as necessary.

The second step S200, which may be referred to as "key setup", generates permutations of the Sbox entries with a variable length key and stores them back into the Sbox. As shown in FIG. 1, S200 is step for performing key setup 256 times by performing new key shuffling (or swapping) in the Sbox having 256 entries. An example of the second, key setup step S200 follows.

```
for i=0 to 255:
    j=(K[k] + Sbox[i] + j) mod 256;
    swap (&Sbox[i], Sbox[j]);
    k=(k+1).
```

The Sbox may now contain random permutations of its original entries. Further, the Sbox may evolve with use. The index i may ensure that every entry changes and the index j may ensure that the entries change randomly.

Describing the key setup in more detail, in a first step, certain variables and the indexes i and j are initialized. The variable k is used later during a swapping step. In a next step, the RC4 permutation calculation is performed. The permutation calculation may be performed according to:

$$j=(K[k]+Sbox[i]+j) \bmod 256.$$

In the first iteration, k=Sbox[0]. However, in subsequent iterations, k is equal to sbox_next_i, which may be Sbox[i+1].

In a next step, Sbox[i] is set to Sbox[j] and Sbox[j] is set to Sbox[i+1]. In an example hardware implementation, an Sbox register may be used to facilitate the swapping function.

At a next step, the index i is incremented and the algorithm is repeated until the index i is greater than 255. It is understood by those of skill in the art that the loop is not necessarily repeated 256 times, but that the value of i is determined by the size of the Sbox and that the modulo arithmetic also depends on the size of the Sbox.

As shown in FIG. 1 and described above, step S200 may include multiple read or write operations, for example, four (4) read or write operations. These may include reading S[i] in the i-th address of the Sbox, reading S[j] in the j-th address of the Sbox, writing S[i] in the j-th address of the Sbox, and writing S[j] in the i-th address. If the Sbox is a single port memory, for example, a single port SRAM, four (4) clock cycles are required for to perform the key setup.

In a third message processing or "data ciphering" step S300, random Sbox entries may be used to either convert a message to cipher text or recreate a message from cipher text. Example pseudo code for the data ciphering" step S300, in which a message is converted to cipher text follows.

```
i=j=0;
for each byte of the message,
repeat
    i=(i+1) mod 256;
    j=(Sbox[i]+j) mod 256;
    swap (&Sbox[i], Sbox[j]);
    x=(Sbox[i]+Sbox[j]) mod 256;
    Dout=Din ⊕ S[x];
end.
```

Describing the data ciphering in more detail, in a first step, similar to the key setup, certain variables and the indexes i and j are initialized. That is, indices i and j are set to zero. In a next step, standard RC4 processing calculations are performed, followed by a swapping step. The standard RC4 processing calculations may set the index i equal to ((i+1) mod 256) and the index j equal to ((j+k) mod 256). In the swapping step, Sbox[i] is set to Sbox[j] and Sbox[j] is set to Sbox[i]. As in the key setup, a Sbox register may be used to facilitate the swapping function.

Next, a pseudo-random byte is determined in accordance with the RC4 algorithm. That is, x=(Sbox[i]+Sbox[j]) mod 256. Next, a byte of the cipher text may be generated by exclusive ORing (XORing, for example) a byte of the message with the pseudorandom byte from the Sbox, i.e., Sbox [x].

In a decrypting process, a byte of the cipher text may be XORed with the pseudo-random Sbox byte to recreate a byte of the message. Next, a step may be performed, which checks to determine whether or not j is equal to i+1. If j is not equal to i+1, then the variable K is equated to Sbox[i+1]. Alternatively, if j is equal to i+1, then if the last byte of the message has not yet been processed, the algorithm is repeated by looping back.

FIG. 2 is an example illustrating the limited time allotted for performing key setup. The example of FIG. 2 illustrates the communications between a MAC (Media Access Control) controller and a modem, for an 802.11g 54 Mbps transmission running the RC4 algorithm with an integrity check. As illustrated in FIG. 2, the MAC controller transmits a transmit enable (TX ENABLE) signal to the modem. In response, the modem transmits a transmit ready (TX READY) signal and a transmit clock (TX CLOCK) signal to the MAC controller. As shown, the TX CLOCK signal includes burst clocks having a symbol time of 4 µseconds.

During the burst clocks, the MAC controller transmits data (TX DATA) to the modem. As shown in FIG. 2, the TX DATA may include rate (RATE) data, which indicates a rate of a transmitted frame, length (LEN) data, which indicates a length of the transmitted frame, header (HDR) data which indicates a header of the transmitted frame, and a body (BDY) of the transmitted frame.

The key setup time may be defined as the time period from the issuance of the TX ENABLE signal by the MAC controller to the transmission of the body of the transmitted frame BDY by the MAC controller. As indicated above, for an 802.11g 54 Mbps transmission, the maximum allowed key setup time may be on the order of 12.5 µseconds. This key setup time is characteristic of several 802.11 WLAN key setup times, for example 802.11a or 802.11g.

Conventional architectures may include one or more multiport memories operating in conjunction with a single, sequential architecture, finite state machine unit. However, sequential architectures and/or single finite state machine unit may not enable sufficient reduction of the key set-up time. Additionally, such architectures may be unsuitable for wireless communications because they may store the key in an external memory and/or may not change the key for every frame.

SUMMARY OF THE INVENTION

Example embodiments of the present invention are directed to a security circuit using at least two finite state machine units for storing data to and reading data from a multiport memory in a pipelined manner and an intermediate memory, for facilitating transfer of data between the at least two finite state machine units.

Other example embodiments of the present invention are directed to a key computation circuit in a system for encryption or decryption implementing an encryption/decryption algorithm including a control logic coupled to receive a request for a key and to transmit the key, configured to compute the key according to the encryption/decryption algorithm, wherein the control logic includes at least two finite state machine units operating in a pipelined manner and an intermediate memory and is configured to read s-values from at least one multiport memory into the intermediate memory and a first of the at least two finite state machine units, calculate new s-values, and write the new s-values from a second of the at the least two finite state machine units to the intermediate memory and the at least one multiport memory.

Other example embodiments of the present invention are directed to a method, including storing data to and reading data from a multiport memory to at least two finite state machine units in a pipelined manner and transferring data between the at least two finite state machine units via an intermediate memory.

Other example embodiments of the present invention are directed to a method of computing a key for encryption or decryption according to an encryption/decryption algorithm including receiving a request for a key, computing a key according to the encryption/decryption algorithm, the encryption/decryption algorithm being performed by reading s-values from at least one multiport memory into a first of at least two finite state machine units operating in a pipelined manner, calculating new s-values, and writing the new s-values from a second of the at least two finite state machine units operating in a pipelined manner to the at least one multiport memory, and transmitting the key.

Other example embodiments of the present invention are directed to a method of performing key setup using a circuit which includes at least one multiport memory capable of synchronous read and write, the method including incrementing a value "i", reading a value $S_i$ from the at least one multiport memory into a first of at least two finite state machine units, simultaneously with reading the value $S_i$, adding the value $S_i$ to a value "j", reading a value $S_j$ from the at least one multiport memory into the first of the at least two finite state machine units, simultaneously with reading a value $S_j$, adding the value $S_j$ to the value $S_i$ to generate a value "x" and storing the value $S_i$ into the value $S_j$ in a second of the at least two finite state machine units, reading a value "k" by loading a value $S_x$, and simultaneously with reading the value "k", storing the value $S_j$ into the value $S_i$ in the second of the at least two finite state machine units and incrementing the value "i".

Other example embodiments of the present invention are directed to a method of performing data ciphering including reading and writing i values, j values, and data including reading and writing i values, j values, and data, where i and j are greater than zero and less than a maximum, in a multiport memory, by reading the i values and writing the j values in a pipelined manner, reading the data and writing the i values in a pipelined manner, and reading the j values.

In example embodiments of the present invention, the security circuit or processing unit may implement an encryption algorithm, for example, an RC4 encryption algorithm.

In example embodiments of the present invention, the security circuit or processing unit may provide key setup and/or data ciphering.

In example embodiments of the present invention, the security circuit or processing unit may operate in any environment where the key is changed every frame, for example, a communication network, for example, a wireless communication network (for example, any of the 802.11 family of wireless communication networks), a web browser, or any other application with limiting time constraints, for example, limited key setup time and/or limited data ciphering time.

In example embodiments of the present invention, the security circuit may operate, for example, a wireless LAN application and the security circuit may operate in conjunction with, or as part of, a MAC controller.

In example embodiments of the present invention, the security circuit may be used to perform key setup and/or data ciphering faster.

In example embodiments of the present invention, the FSMs may be modular in nature, thereby facilitating design and/or testing of the processing unit by a chip designer. In example embodiments of the present invention, the FSMs may have dedicated functions, which may be pipelined together. For example, in example embodiments of the present invention, one (or more) FSM may be a read finite state machine, whereas another (or other) FSM may be a write finite state machine.

BRIEF DESCRIPTION OF THE DRAWINGS

The present invention will become more fully understood from the detailed description given below and the accompanying drawings, which are given for purposes of illustration only, and thus do not limit the invention.

FIG. 10 illustrates key setup timing in accordance with an example embodiment of the present invention in more detail.

FIG. 11 illustrates data ciphering timing in accordance with an example embodiment of the present invention in more detail.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

DETAILED DESCRIPTIONS OF EXAMPLE EMBODIMENTS

Figure 3:
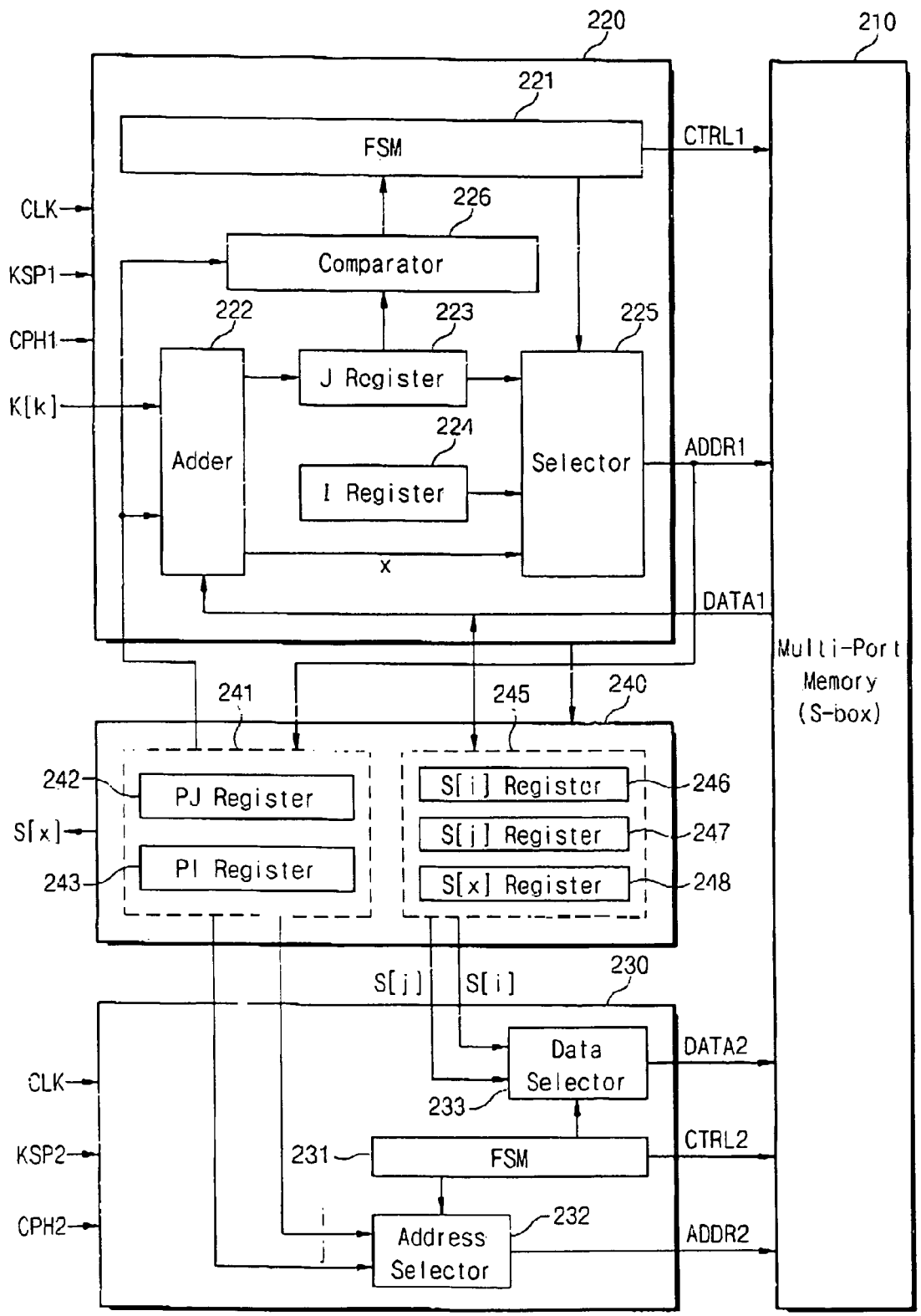
FIG. 3 illustrates a processing unit in accordance with an example embodiment of the present invention.

FIG. 3 illustrates a processing unit 200 in accordance with an example embodiment of the present invention. As illustrated in FIG. 3, the processing unit 200 may include a first finite state machine (FSM) unit 220, a second finite state machine (FSM) unit 230, an intermediate storage unit 240, and a multiport memory (or S-box) 210. The first FSM unit 220 receives a clock signal CLK, a first Key_setup_start signal KSP1, a first Data_cipher_start signal CPH1, and a key signal K[k] from an external device and signals from the intermediate storage 240. The first FSM unit 220 supplies a first control signal CTRL1 and a first address signal ADDR1 to the multiport memory 210 and receives a first data signal DATA1 from the multiport memory 210.

The second FSM unit 230 also receives the clock signal CLK, a second Key_setup_start signal KSP2, and a second Data_cipher start signal CPH2 from an external device as well as signals from the intermediate storage 240 and outputs a second data signal DATA2, a second control signal CTRL2, and a second address signal ADDR2 to the multiport memory 210.

In an example embodiment, the first FSM unit 220 may include a read finite state machine (FSM) 221, an adder 222, an index j register 223, an index i register 224, a selector 225, and/or a comparator 226.

In an example embodiment, the second FSM unit 230 may include a write finite state machine (FSM) 231, an address selector 232, and a data selector 233.

In an example embodiment, intermediate storage 240 may include a first register bank 241 further including a previous index j register 242, a previous index i register 243 and a second register bank 245 further including an S[i] register 246, an S[j] register 247, and an S[x] register 248. The exchange of data between the first FSM unit 220, the second FSM unit 230, the intermediate storage 240, and the multiport memory 210 is described in more detail below with reference to example embodiments illustrated in FIGS. 8-9.

In an example embodiment, the processing unit 200 includes at least two finite state machine units, for example, FSM units 220 and 230, an intermediate storage 240 for data latching between the FSM units 220, 230 and a multiport memory 210. In an example embodiment, the FSM units 220, 230 use a common clock CLK and separate Key_setup_start signals KSP1, KSP2 and Data_cipher_start signals CPH1, CPH2.

In an example embodiment, the FSM units 220, 230 operate in a pipeline fashion, operate in parallel, and/or operate in multiple stages, independently, and with their own functionality which will be described in further detail below.

The read finite state machine 221 controls a reading operation for the multiport memory 210 in response to the first_setup_start signal KSP1 and the Data_cipher_start signal CPH1.

Figure 1:
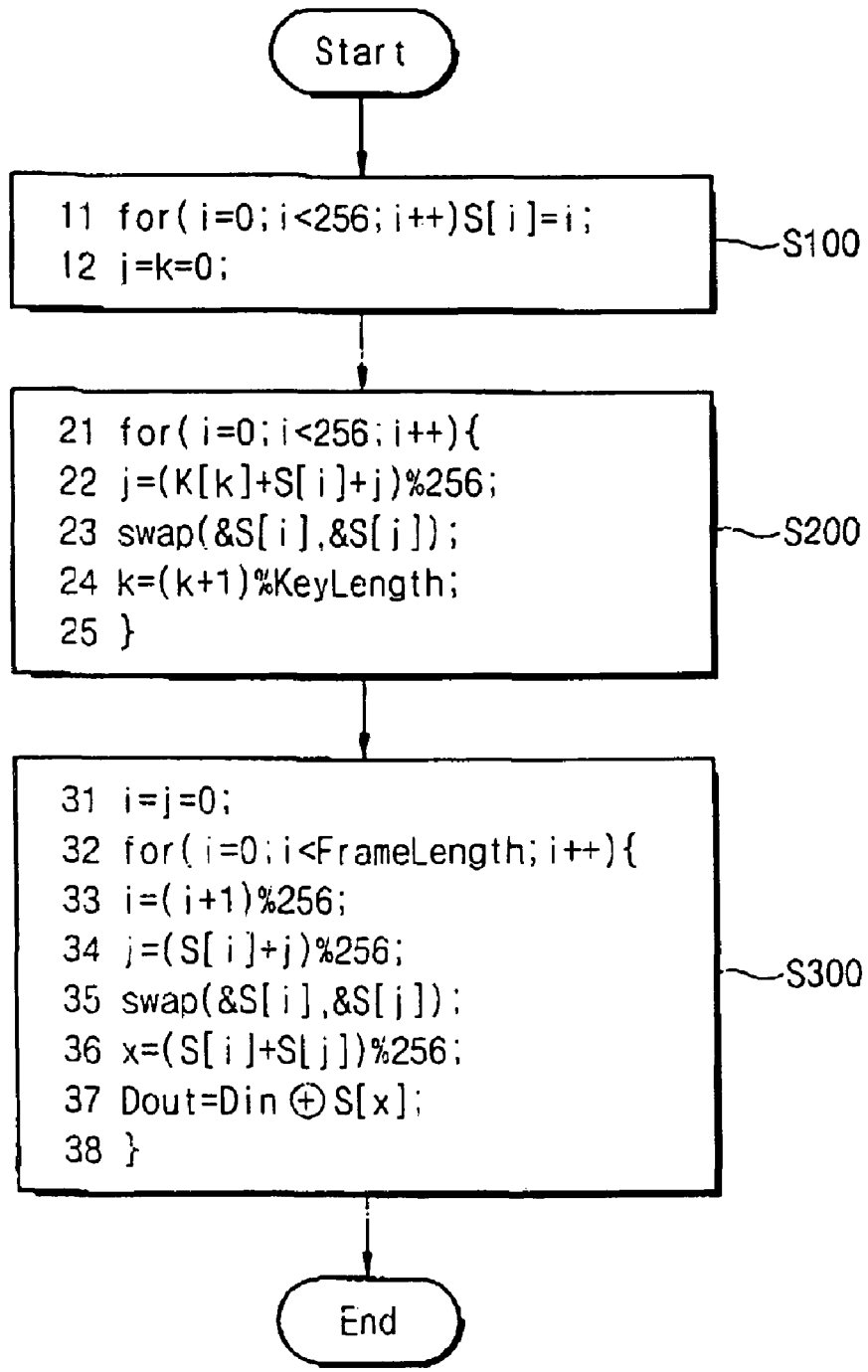
FIG. 1 is a flowchart illustrating the main steps of a conventional RC4 algorithm.
Figure 2:
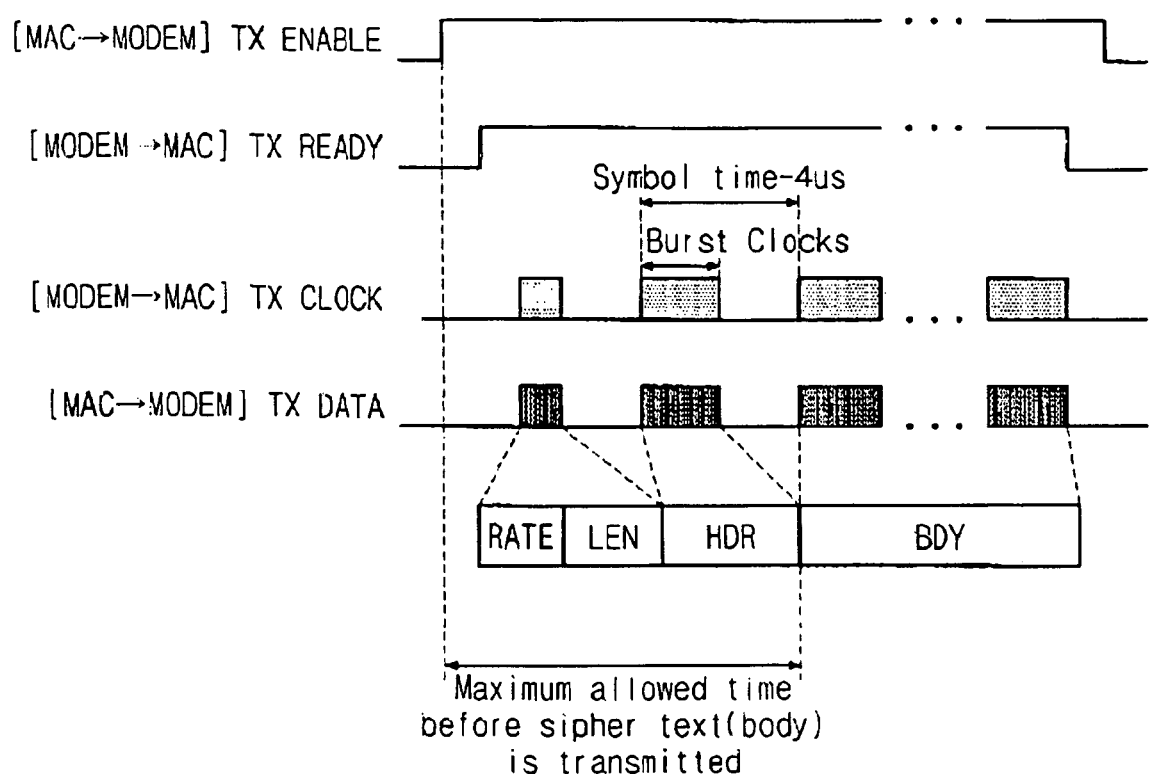
FIG. 2 is an example illustrating the limited time allotted for performing key setup.

The adder 222 performs an adding process which is shown in line 22 during the key-setup step (S200) or in line 34 and 36 during the data ciphering step (S300) of FIG. 1. The adder 222 generates a new j-address by receiving a key signal K[k] from a key register (not shown), an S[i] data from the multiport memory 210, and a j-address from the intermediate storage 240 in response to the first Key_setup_start_signal KSP1 during the key_setup step (S200). The new j-address is provided to the index j-register 223.

The adder 222 generates a new j-address by receiving an S[i] data from the multiport memory 210 and a j-address from the intermediate storage 240 in response to the Data_cipher_start signal CPH1 during the data ciphering step (S300). The new j-address is provided to the j-register 223.

Further, the adder 222 generates a pseudo-random address x by receiving an S[i] data and an S[j] data from the intermediate storage 240.

The index j-register 223 stores the new address provided from the adder 222. The index i-register 224 increases the i-address from 0 to 255 step by step.

The selector 225 provides an address ADDR1 to the multiport memory 210 by selecting one of the j-address from the index j-register 223, the i-address from the index i-address 224, and the x-address from the adder 222 according to the control signal from the read finite state machine 221.

The comparator 226 compares the j-address from the intermediate storage 240 and the new j-address from the index j-register 223. When the two j-addresses are the same, the comparator 226 provides a detecting signal to the read finite state machine 221. If the two j-addresses are the same, the finite state machine 221 controls the multiport memory 210 not to output data from the multiport memory 210 because the stored data in the intermediate storage 240 and the data from the multiport memory 210 are the same.

Referring to FIG. 3 again, the intermediate storage 240 includes the first register bank 241 and the second register bank 245.

The first register bank 241 stores the i-address or the j-address outputted from the first FSM unit 220. The j-address outputted from the first FSM unit 220 is stored in the previous index j register 242 and the i-address outputted from the first FSM unit 220 is stored in the previous index i register 243.

The second register bank 245 stores S[i] data, S[j] data, and S[x] data outputted from the multiport memory 210. The S[i] data is stored in the S[i] register 246, the S[j] data is stored in the S[j] register 246, and the S[x] data is stored in the S[x] register 248. The S[x] data will be supplied to the XOR gate 360 in FIG. 6 according to the control signal from the first FSM unit 220.

Referring to FIG. 3 again, the second FSM unit 230 includes the second finite state machine 231, an address selector 232, and a data selector 233. The second finite state machine 231 controls a write operation for the multiport memory 210 in response to the second Key_setup_start signal KSP2 and the second Data_cipher_start signal CPH2. The operation of the second finite state machine 231 will be described in detail using the state diagram in FIG. 5.

The address selector 232 selects one of the i-addresses outputted from the previous index i register 243 and a j-address outputted from the previous index j register 242 according to a control signal from the second finite state machine 231 and provides the selected address ADDR2 to the multiport memory 210.

The data selector 233 selects one of the S[i] data outputted from the S[i] register 246 and S[j] data outputted from the S[j] register 247 according to a control signal from the second finite state machine 231 and provides the selected data DATA2 to the multiport memory 210.

Figure 4:
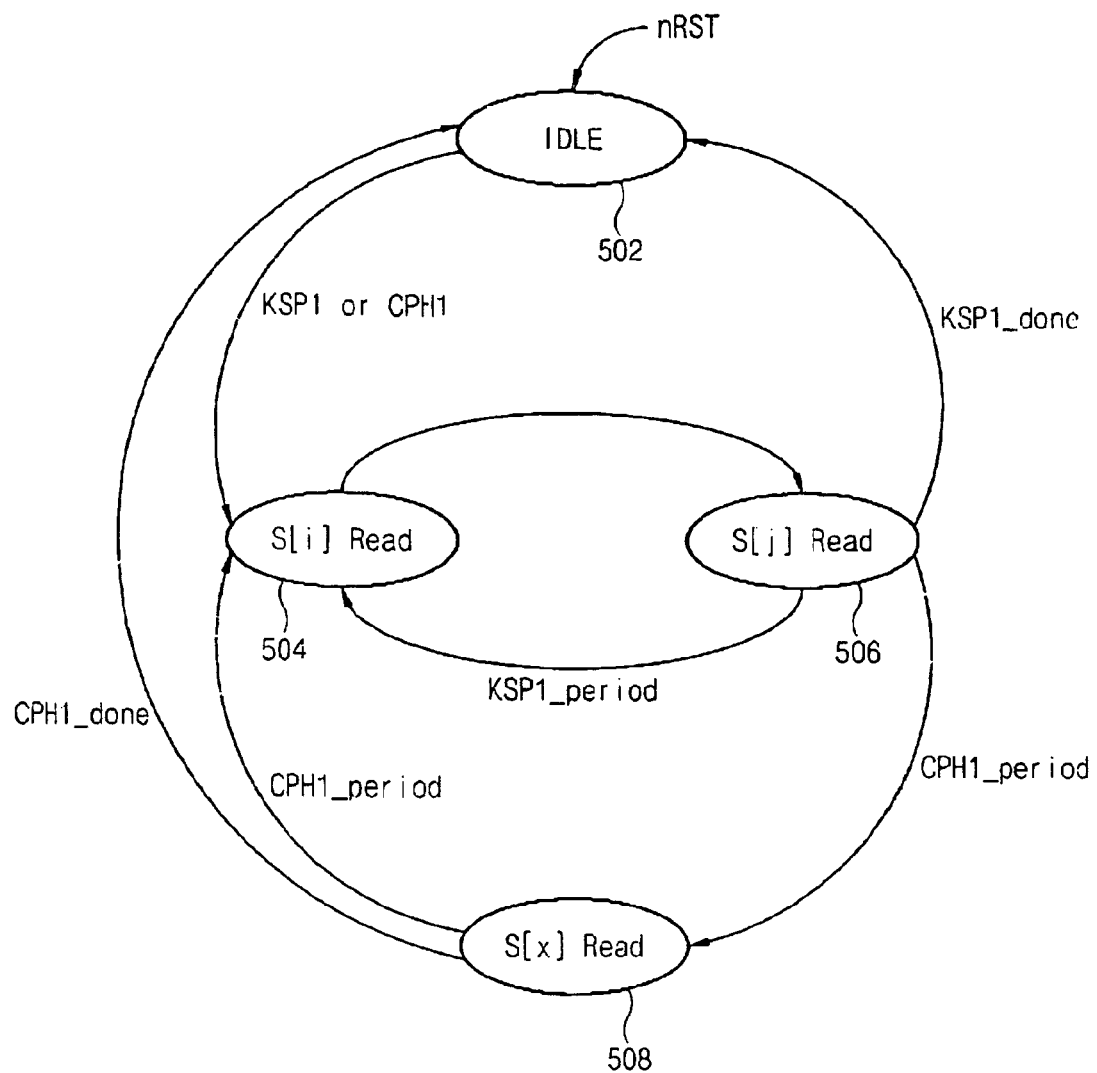
FIG. 4 illustrates a state diagram of a read finite state machine (FSM) of FIG. 3 in accordance with an example embodiment of the present invention.

FIG. 4 illustrates a state diagram of the FSM unit 220 of FIG. 3, in accordance with an example embodiment of the present invention. In the example state diagram illustrated in FIG. 4, the FSM unit 220 is utilized to read data to the multiport memory 210. In an example embodiment, the FSM unit 220 begins in an idle state 502, after receipt of a reset signal nRST. If the FSM unit 220 receives the Key_setup_start signal KSP1, the first FSM unit 220 transitions to state 504 and reads S[i] and then reads S[j] at state 506, which is repeated for every cycle during key setup, for example, until a key setup complete signal KSP1_done is received. The signal KSP1_period means that the read finite state machine 221 is in the key set-up period. When the key setup period is complete, a KSP1_done signal is received and the first FSM unit 220 transitions from state 506 back to the idle state 502.

In the event the Data_cipher_start signal CPH1 is received by the first FSM unit 220 in the idle state 502, the first FSM unit 220 transitions to state 504 to read S[i], then to state 506 to read S[j], then to state 508 to read S[x] and repeats this loop for every cycle during the data cipher period, for example, until a data cipher complete signal CPH1_done is received. The signal of CPH1_period means that the first FSM unit 220 is in the data ciphering period. When the data ciphering period is complete, a CPH1_done signal is received and the first finite state machine unit 220 transitions from state 508 back to the idle state 502.

In an example embodiment, the number of times this loop is repeated depends on the frame length.

In an example embodiment, during data ciphering, the read S[x] operation may be accompanied by the generation of a pseudo-random number (PN) which need not be performed during key setup.

An example of key setup timing is described in more detail below with reference to FIG. 8.

Figure 5:
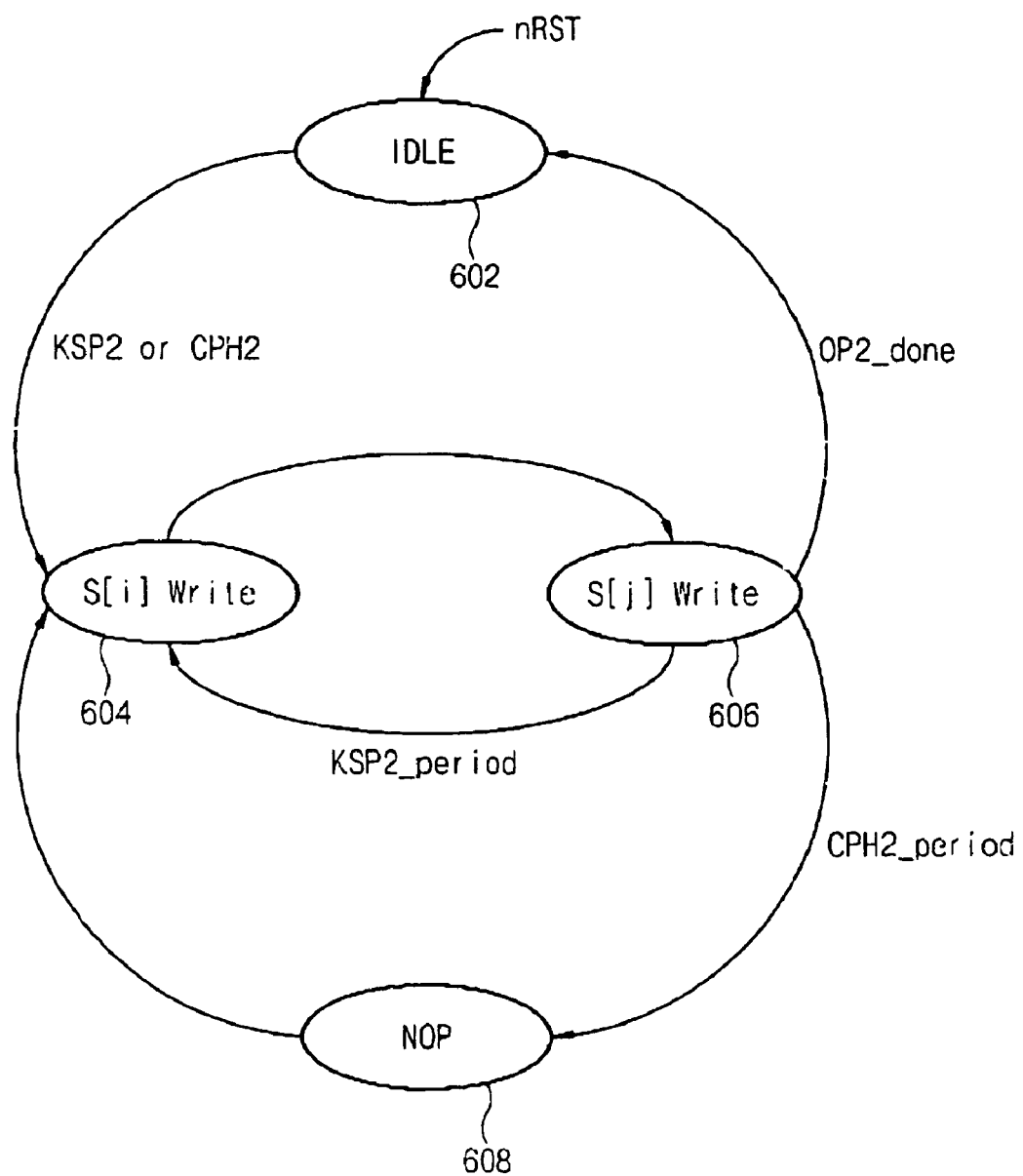
FIG. 5 illustrates a state diagram for a write FSM unit of FIG. 3 in accordance with an example embodiment of the present invention.

FIG. 5 illustrates a state diagram for the second FSM unit 230 in FIG. 3 in accordance with an example embodiment of the present invention. In the example illustrated in FIG. 5, the second FSM unit 230 is utilized to write data to the multiport memory 210. Similar to the first FSM unit 220 of FIG. 4, the second FSM unit 230 of FIG. 5 begins in an idle state 602, after receipt of a reset signal nRST.

If the second FSM unit 230 receives the Key_setup_start signal KSP2, the second FSM unit 230 transitions to state 604 and writes S[i] and then writes S[j] at state 606, which is repeated for every cycle during key setup, for example, until a key setup complete signal OP_done is received. The KSP2_period means that the second FSM unit 230 is in the key set-up period. In an example embodiment, during the first stage of a write operation, values that are stored in the intermediate storage 240, for example in the previous index j register 242, the previous index i register, the S[i] register 246, the S[j] register 247, and/or the S[x] register 248, are utilized for the first write operation.

When the key setup period is complete, a OP2_done signal is received and the second FSM unit 230 transitions from state 606 back to the idle state 602. The OP2_done signal means that the key set-up period or the ciphering period is finished.

In the event the Data_cipher_start signal CPH2 is received by the second FSM unit 230 in the idle state 602, the second FSM unit 230 transitions to state 604 to write S[i], then to state 606 to write S[j], then to state 608 to perform a No Operation (NOP) 608 in response to respective clock cycles and repeats this loop for every cycle during the data cipher period, for example, until a data cipher complete signal CPH2_done is received.

In an example embodiment, the number of times this loop is repeated depends on the frame length.

In an example embodiment, during data ciphering, the write operation may be accompanied by NOP 608. The NOP 608 is for outputting of a S[x] data from the intermediate storage 240, and the NOP 608 is not controlled by the write operation and is not performed during key setup. When the data ciphering period is complete, the CPH2_done signal is received and the second FSM unit 230 transitions from state 608 back to the idle state 602. An example of data ciphering timing is described in more detail below with reference to FIG. 9.

Figure 6:
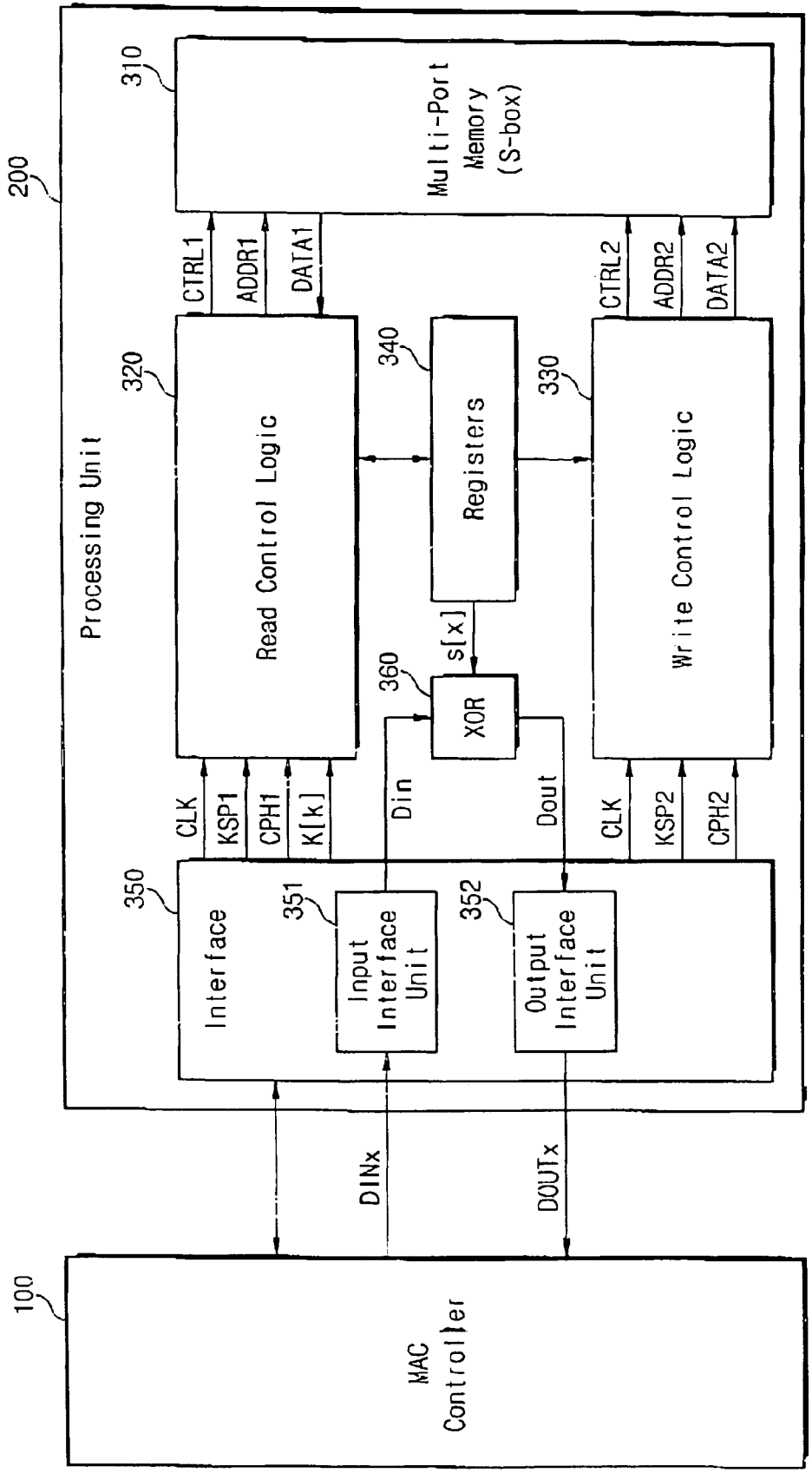
FIG. 6 illustrates an environment in which the processing unit of FIG. 3 may be utilized in accordance with an example embodiment of the present invention.

FIG. 6 illustrates an environment in which the processing unit 200 of FIG. 3 may be utilized. As illustrated in FIG. 6, the processing unit 200 may include read control logic 320, which may include a first FSM unit, for example, FSM unit 220 of FIG. 3, write control logic 330, which may include a second FSM unit, for example, FSM unit 230 of FIG. 3, registers 340, which may act as intermediate storage, for example, intermediate storage 240 of FIG. 3, and a multiport memory 310, for example multiport memory 210 of FIG. 3.

In an example embodiment, the processing unit 200 of FIG. 6 may further include an interface unit 350 in order to interface with a MAC controller, for example, MAC controller 100. The MAC controller 100 and the processing unit 200 may exchange signals, for example, a clock signal, Key_setup_start signals, Data_cipher_start signals, and data signals, as described above in conjunction with FIG. 3.

In an example embodiment, the interface unit 350 may also include an input interface unit 351, through which the processing unit 200 receives input data DINx from the MAC controller 100. The interface unit 350 may also include an output interface unit 352 for transferring data, for example DOUTx, from the processing unit 200 to the MAC controller 100.

In an example embodiment the processing unit 200 may also include an exclusive OR (XOR) gate 360 for controlling the flow of data out of the register 340. The XOR gate 360 generates encrypted data by exclusive ORing input data Din from the input interface unit 351 and output data S[x] from the register 340. The generated encryption data Dout is provided to the output interface unit 352.

Figure 7:
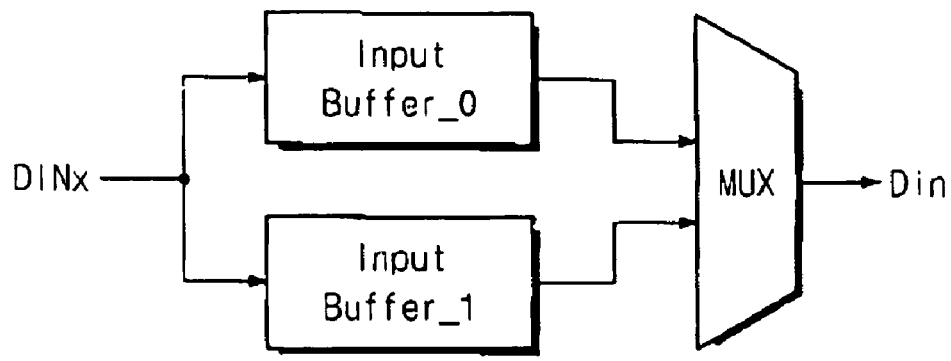
FIGS. 7 and 8 illustrate example embodiments of an interface unit including dual buffers in accordance with an example embodiment of the present invention.
Figure 8:
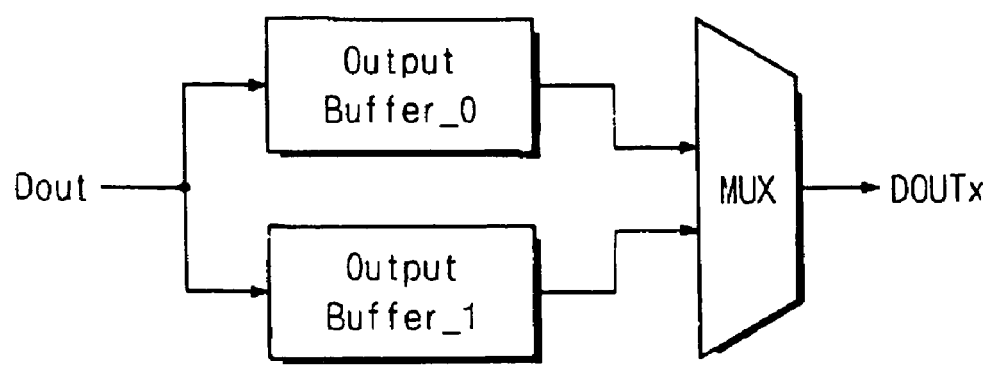

FIG. 7 and FIG. 8 illustrate an example embodiment of the interface unit 350 including dual buffers for each of the input interface unit 351 and the output interface unit 352 for pipelined processing.

In FIG. 7, the input interface unit 351 includes a first input buffer 353 and a second input buffer 354 for receiving the input data DINx from the MAC controller 100, and a multiplexer 355 for selecting one of the input buffers and generating input data Din to be ciphered. If the multiplexer select the first input buffer storing input data transferred by the MAC controller 100, the second input buffer 354 of the input interface unit 351 can receive a next input data to be ciphered from the MAC controller 100 while the first input buffer 353 provides the current input data to be ciphered for data ciphering.

After the completion of data ciphering of the current input data Din, the multiplexer changes the selection of the input buffers and provides input data form the second input buffer. At the same time, the MAC controller transfers next input data to be ciphered into the first input buffer 353.

In FIG. 8, the output interface unit 352 includes a first output buffer 356 and a second output buffer 357 for receiving the ciphered output data Dout, and a multiplexer 358 for selecting one of the output buffers and generating a ciphered output data DOUTx. If the multiplexer selects the first output buffer 356 storing ciphered output data, the second output buffer 357 of the output interface unit 352 can receive a next ciphered output data from the output data Dout while the first output buffer 356 provides the ciphered output data in the first output buffer 356 to the MAC controller 100.

After completing the transfer of ciphered output data stored in the first output buffer 356 to the MAC controller 100, the multiplexer changes the selection of the output buffers and provides ciphered output data in the second input buffer 357 to the MAC controller 100. At the same time, the next ciphered output data from the output data Dout is transferred into the first output buffer 356.

Figure 9:
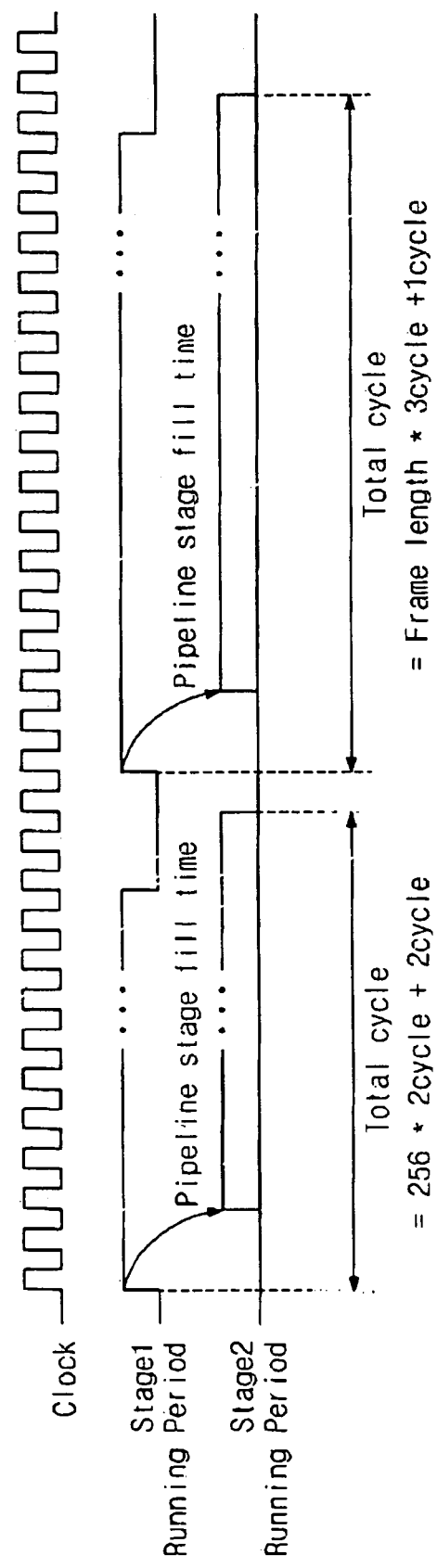
FIG. 9 illustrates an example timing diagram of the processing unit of FIG. 3 in accordance with an example embodiment of the present invention.

FIG. 9 illustrates an example timing diagram for the processing unit 200 of FIG. 3. FIG. 9 illustrates the timing diagram for both key setup and data ciphering. As illustrated in FIG. 9, when the running period is "high", both stage 1 (for example, read) and stage 2 (for example, write) may be performed by the separate FSM units 220, 230 and the respective calculation results are transferred through intermediate storage 240. As illustrated in FIG. 9, for key setup, the total cycle time may be:

(256 times 2 cycles) plus 2 cycles=514 bytes of data.

For data ciphering, the total cycling time may be:
(the frame length times 3 cycles) plus 1 cycle.

As indicated in FIG. 9, the processing unit 200 of example embodiments of the present invention may perform key setup and date ciphering as two stages and perform one or both with a pipelined architecture. In example embodiments, using such a pipelined architecture, operating frequency and/or throughput may be improved.

FIG. 10 illustrates key setup timing in more detail. As illustrated in FIG. 10, for each cycle, a read stage and a write stage are pipeline-executed with simultaneous read and write capability. In such a pipelined architecture, key setup may be reduced as illustrated in FIG. 10, because, while the value S[i] is read from address i, the value S[i] may be written to address j and while the value S[j] is read from address j, the value S[j] may be written to address i. As illustrated in FIG. 10, this process may reduce the time necessary for key setup.

Referring to FIG. 10, the processing unit 200 reads S[0] data from the i-address (i=0) in the multiport memory 210 in a first clock cycle and stores the S[0] data to the S[i] register 246.

In a second clock cycle, the processing unit 200 reads S[j1] data from the j1-address in the multiport memory 210 and stores the S[j1] data to the S[j] register 247. The j1-address is derived from the permutation calculation according to the following equation: j=(K(k)+Sbox(i)+j)mod 256. That is, an S[0] data outputted from the multiport memory 210, a K[0] data from a key register (not shown), and j0-address provided from the previous index j register 242 are added together; and the added values are divided by 256, and the modulo is to be the j-address. The j0-address defines in the initialization step S100 of the RC4 algorithm and j0=0.

In a third clock cycle, the processing unit 200 writes S[j1] data stored in the S[j] register 247 in the i-address (i=0) in the multiport memory 210. Simultaneously, the processing unit 200 reads the S[1] data from the i-address(i=1)("j1-address") in the multiport memory 210 and stores the S[1] data in the S[i] register 246. The second key set-up signal KSP2 is delayed for two clocks than the first key set-up signal KSP1, therefore, the second Data_cipher_start signal CPH2 is delayed for two clocks than the first Data_cipher_start signal CPH1 and the data write stage is performed by in the third clock cycle.

In a forth clock cycle, the processing unit 200 writes S[0] data stored in the S[i] register 246 in the j-address(j=1)("j1-address") in the multiport memory 210. Simultaneously, the processing unit 200 reads the S[j2] data from the j-address (j=2) ("j2-address") in the multiport memory 210 and stores the S[j2] data in the S[j] register 247. The j2-address is derived from the permutation calculation according to the following equation: j=(K(k)+Sbox(i)+j)mod 256. That is, an S[1] data outputted from the multiport memory 210, a K[1] data from the key register (not shown), and j1-address provided from the previous index j register 242 are added together; the added values are divided by 256, and the modulo is to be the j-address.

In a fifth clock cycle, the processing unit 200 writes S[2] data stored in the S[j] register 247 in the i-address (i=1) in the multiport memory 210. Simultaneously, the processing unit 200 reads the S[2] data from the i-address(i=2) in the multiport memory 210 and stores the S[2] data in the S[i] register 246.

In a sixth clock cycle, the processing unit 200 writes S[1] data stored in the S[i] register 246 in the j-address(j=2) ("j2-address") in the multiport memory 210. Simultaneously, the processing unit 200 reads the S[j3] data from the j-address (j=3) ("j3-address") in the multiport memory 210 and stores the S[j3] data in the S[j] register 247. The j3-address is derived from the permutation calculation described above equation: j=(K(k)+Sbox(i)+j)mod 256.

The read and write stages in the multiport memory 210 are repeated until a $512^{th}$ clock cycle is completed. In a $513^{th}$ clock cycle, the processing unit 200 writes S([j256] data stored in the S[j] register 247 at the i-address(i=255) in the multiport memory 210. In a $514^{th}$ clock cycle, the processing unit 200 writes S[j255] data stored in the S[i] register 246 at the i-address(i=256) in the multiport memory 210

Through the above stages, the setup step S200 for the RC4 encryption algorithm is finished.

An encryption algorithm method according to a conventional circuit having a single port memory uses four (4) clocks for one stage loop and the setup step S200 needs 1024 clocks.

Further, an encryption method using a dual port memory uses three (3) clocks for one stage loop and the setup step S200 needs 768 clocks.

However, an encryption algorithm method according to an embodiment of the present invention needs one (1) clock for S[i] write stage and S[i+1] read stage; one loop stage needs average two (2) clocks since S[jn] write stage and S[j(n+1)] read stage are performed within one clock by using of a pipelined method. Thus, the setup step S200 for the RC4 encryption algorithm needs 514 clocks in total. That is, according to an embodiment of the present invention, 510 clocks can be reduced compared to a conventional encryption algorithm having a single port memory.

Further, according to an embodiment of the present invention, j(n)-address and j(n+1)-address can be the same. For example, the processing unit 200 writes S[1] data at a j2-address and simultaneously reads S[j3] data from j3-address in the sixth clock cycle. Assuming j2=j3=7, the processing unit 200 writes S[1] data at a seventh($7^{th}$)-address and simultaneously reads S[1] data from the seventh($7^{th}$)-address.

If the multiport memory 210 is a dual-port memory, the dual-port memory does not need a read stage since S[1] data to be read is stored in a S[i] register 246. Thus, the processing unit 200 according to an embodiment of the present invention may eliminate a read stage.

FIG. 11 illustrates data ciphering timing in more detail. As illustrated in FIG. 11, for each cycle, a read stage and write stage are pipeline-executed with simultaneous read and write capability. In such a pipelined architecture, data ciphering timing may be reduced as illustrated in FIG. 11, because, while the value S[i] is read from address i, the value S[j] may be written to address i, and while the value S[x] is read, the value S[i] may be written to address j (while the value S[j] is read from address j, the NOP is performed). As illustrated in FIG. 11, this process may reduce the time necessary for data ciphering.

The sequence of the write[i] at address j and write[j] at address I can be changed in an embodiment of the invention.

As set forth above, in example embodiments of the present invention, the processing unit may be a stand-alone device, may operate in conjunction with another device, for example MAC controller, or may be integrated in another device, for example, a MAC controller. Further, as set forth above, in example embodiments of the present invention, one or more of the stand-alone devices, cooperating devices and/or the integrated devices may be connected to a common bus.

As set forth above, in example embodiments of the present invention, the processing unit may act as a security circuit implementing an encryption algorithm, for example, an RC4 encryption algorithm.

As set forth above, in example embodiments of the present invention, the processing unit may act as a security circuit by providing key setup and/or data ciphering.

As set forth above, in example embodiments of the present invention, the processing unit may act as a security circuit in a communication network, for example, a wireless communication network (for example, any of the 802.11 family of wireless communication networks), a web browser, or any other application with limiting time constraints, for example, limited key setup time and/or limited data ciphering time.

As set forth above, in example embodiments of the present invention, the FSMs may be modular in nature, thereby facilitating design and/or testing of the processing unit by a chip designer.

As set forth above, in example embodiments of the present invention, the FSM units may be pipelined based on any factor, for example, read and write (for example, synchronous read and write), or any other functional pipelining.

As set forth above, in example embodiments of the present invention, the FSM units may vary in number, for example, any number greater than two, as may the number of FSMs per FSM unit.

As set forth above, in example embodiments of the present invention, the FSM units and the FSMs may be implemented in hardware, software, or a combination thereof.

It will be apparent to those skilled in the art that other changes and modifications may be made in the above-described example embodiments without departing from the scope of the invention herein, and it is intended that all matter contained in the above description shall be interpreted in an illustrative and not a limiting sense.

What is claimed is:

1. A security circuit, comprising:
   at least two finite state machine units, storing data to and reading data from a multiport memory in a pipelined manner; and
   an intermediate memory, for facilitating transfer of data between the at least two finite state machine units, wherein
   the at least two finite state machine units include,
      a read finite state machine unit configured to read the data from the multiport memory in the pipelined manner and output the data to the intermediate memory, and
      a write finite state machine unit configured to receive the data from the intermediate memory and write the data to the multiport memory in the pipelined manner,
      the read finite state machine is configured to supply a first command and a first address to the multiport memory,
      the write finite state machine is configured to supply a second command and a second address to the multiport memory,
      the read and write finite state machines are configured to operate simultaneously with the multiport memory, and
      the intermediate memory includes a plurality of registers for storing previous addresses to access the multiport memory or temporary substitution box (Sbox) data for encryption/decryption.

2. The security circuit of claim 1, wherein the read finite state machine unit comprises:
   an adder for adding data from the multiport memory and stored data in the intermediate memory,
   a first index register storing a new address from a result of the adder, a second index register storing a counting value for access of the multiport memory,
   a selector for selecting an address of a read port of the multiport memory from the first index register and the second index register, and
   a read finite state machine to control the state of the read finite state machine unit.

3. The security circuit of claim 2, wherein the read finite state machine unit further comprises a comparator to compare an address stored in the intermediate memory and the new address from the first index register.

4. The security circuit of claim 3, wherein when the address from the intermediate memory and the new address from the first index register are the same, the comparator provides a detecting signal to the read finite state machine unit.

5. The security circuit of claim 4, wherein if the two addresses are the same, the read finite state machine unit controls the multiport memory not to output data from the multiport memory.

6. The security circuit of claim 1, wherein the multiport memory is a substitution box (Sbox).

7. The security circuit of claim 1, wherein the write finite state machine unit comprises:
an address selector for selecting an address of a write port of the multiport memory,
a data selector for storing data to the multiport memory, and
a write finite state machine to control the state of the write finite state machine unit.

8. The security circuit of claim 1, wherein the security circuit is a processing unit to cipher the data of a MAC controller.

9. The security circuit of claim 1, wherein the security circuit exchanges clock, control, and data signals with a MAC controller.

10. The security circuit of claim 1, the security circuit performing at least one of key setup and data ciphering.

11. The security circuit of claim 1, further comprising an XOR gate for generating encrypted data by exclusive ORing externally supplied input data and output data from the intermediate memory.

12. The security circuit of claim 11, further comprising an interface unit for interfacing with a MAC controller.

13. The security circuit of claim 12, wherein the interface unit comprises an input interface unit and an output interface unit.

14. The security circuit of claim 13, wherein each of the input interface unit and the output interface unit comprises dual buffers for pipelined processing.

15. A key computation circuit in a system for encryption or decryption implementing an encryption/decryption algorithm, comprising:
a control logic coupled to receive a request for a key and to transmit the key, configured to compute the key according to the encryption/decryption algorithm, wherein the control logic includes at least two finite state machine units operating in a pipelined manner and an intermediate memory and is configured to read s-values from at least one multiport memory into the intermediate memory and a first of the at least two finite state machine units, calculate new s-values, and write the new s-values from a second of the at the least two finite state machine units to the intermediate memory and the at least one multiport memory, wherein
the at least two finite state machine units include,
a read finite state machine unit configured to read the data from the multiport memory in the pipelined manner and output the data to the intermediate memory, and
a write finite state machine unit configured to receive the data from the intermediate memory and write the data to the multiport memory in the pipelined manner,
the read finite state machine is configured to supply a first command and a first address to the multiport memory,
the write finite state machine is configured to supply a second command and a second address to the multiport memory,
the read and write finite state machines are configured to operate simultaneously with the multiport memory.

16. The key computation circuit of claim 15, wherein the encryption/decryption algorithm is an RC4 algorithm.

17. The key computation circuit of claim 15, the intermediate memory including a plurality of registers.

18. A method, comprising:
storing data to and reading data from a multiport memory to at least two finite state machine units in a pipelined manner; and
transferring data between the at least two finite state machine units via an intermediate memory, wherein
the at least two finite state machine units include,
a read finite state machine unit configured to read the data directly from the multiport memory in the pipelined manner and output the data to the intermediate memory, and
a write finite state machine unit configured to receive the data from the intermediate memory and write the data to the multiport memory in the pipelined manner,
the read finite state machine is configured to supply a first command and a first address to the multiport memory,
the write finite state machine is configured to supply a second command and a second address to the multiport memory,
the read and write finite state machines are configured to operate simultaneously with the multiport memory, and
the storing and transferring data enable at least one of key setup and data ciphering.

19. The method of claim 18, wherein data is read to the read finite state machine unit.

20. The method of claim 18, wherein data is written from the write finite state machine unit.

21. A method of computing a key for encryption or decryption according to an encryption/decryption algorithm, comprising:
receiving a request for a key;
computing a key according to the encryption/decryption algorithm, the encryption/decryption algorithm being performed by reading s-values from at least one multiport memory into a first of at least two finite state machine units operating in a pipelined manner, calculating new s-values, and writing the new s-values from a second of the at least two finite state machine units operating in a pipelined manner to the at least one multiport memory; and
transmitting the key, wherein
the first of the at least two finite state machine units is a read finite state machine unit configured to read the data from the multiport memory in the pipelined manner and output the data to an intermediate memory,
the second of the at least two finite state machine units is a write finite state machine unit configured to receive the data from the intermediate memory and write the data to the multiport memory in the pipelined manner,
the read finite state machine is configured to supply a first command and a first address to the multiport memory,
the write finite state machine is configured to supply a second command and a second address to the multiport memory, and
the read and write finite state machines are configured to operate simultaneously with the multiport memory.

22. The method of claim 21, wherein the encryption/decryption algorithm is an RC4 algorithm.

23. A method of performing key setup using a circuit which includes at least one multiport memory capable of synchronous read and write, the method comprising:
incrementing a value "i";

reading a value $S_i$ from the at least one multiport memory into a first of at least two finite state machine units;

simultaneously with reading the value $S_i$ adding the value $S_i$ to a value "j";

reading a value $S_j$ from the at least one multiport memory into the first of the at least two finite state machine units;

simultaneously with reading a value $S_j$, adding the value $S_j$ to the value $S_i$ to generate a value "x" and storing the value $S_i$ into the value $S_j$ in a second of the at least two finite state machine units;

reading a value "k" by loading a value $S_x$; and simultaneously with reading the value "k", storing the value $S_j$ into the value $S_i$ in the second of the at least two finite state machine units and incrementing the value "i", wherein the first of the at least two finite state machine units is a read finite state machine unit configured to read the data from the multiport memory in the pipelined manner and output the data to the intermediate memory, the second of the at least two finite state machine units is a write finite state machine unit configured to receive the data from the intermediate memory and write the data to the multiport memory in the pipelined manner, the read finite state machine is configured to supply a first command and a first address to the multiport memory, the write finite state machine is configured to supply a second command and a second address to the multiport memory, and the read and write finite state machines are configured to operate simultaneously with the multiport memory.

24. The method of claim 23, wherein Si, Sj, $S_x$, a previous i, and a previous j are each stored in a corresponding register.

* * * * *